United States Patent [19]

Ibori et al.

[11] Patent Number: 5,121,283
[45] Date of Patent: Jun. 9, 1992

[54] OVERCURRENT PROTECTIVE CIRCUIT FOR ELECTROSTATIC SELF-TURN-OFF DEVICES

[75] Inventors: Satoshi Ibori; Shigeyuki Baba, both of Funabashi; Hiroshi Fujii, Chiba; Takatsugu Kanbara, Funabashi; Kenji Nandoh, Matsudo, all of Japan

[73] Assignee: Hitachi, Ltd., Tokyo, Japan

[21] Appl. No.: 476,347

[22] Filed: Feb. 7, 1990

[30] Foreign Application Priority Data

Mar. 8, 1989 [JP] Japan .................. 1-53817

[51] Int. Cl.⁵ .................. H03K 17/60; H02H 9/04
[52] U.S. Cl. .................. 361/93; 363/56
[58] Field of Search .................. 361/93, 95; 363/56

[56] References Cited

U.S. PATENT DOCUMENTS

| | | | |
|---|---|---|---|
| 4,404,473 | 9/1983 | Fox | 361/93 |
| 4,428,015 | 1/1984 | Nesler | 361/93 |
| 4,589,051 | 5/1986 | Santurtûn et al. | 363/56 |
| 4,965,710 | 10/1990 | Pelly et al. | 363/56 |
| 4,970,620 | 11/1990 | Lehnhoff et al. | 363/56 |
| 4,975,798 | 12/1990 | Edwards et al. | 361/56 |

FOREIGN PATENT DOCUMENTS

| | | |
|---|---|---|
| 3202319 | 7/1983 | Fed. Rep. of Germany . |
| 0234472 | 11/1985 | Japan .................. 363/56 |
| 61-25319 | 6/1986 | Japan . |
| 63-95722 | 4/1988 | Japan . |
| 63-95728 | 4/1988 | Japan . |
| 0675525 | 7/1979 | U.S.S.R. .................. 363/56 |
| 8605926 | 9/1986 | World Int. Prop. O. . |

*Primary Examiner*—Steven L. Stephan
*Assistant Examiner*—Thomas M. Dougherty
*Attorney, Agent, or Firm*—Antonelli, Terry Stout & Kraus

[57] ABSTRACT

This specification discloses an overcurrent protective circuit for detecting an overcurrent flowing through an electrostatic self-turn-off device and suppressing the overcurrent.

The overcurrent protective circuit according to the present invention comprises a power source for supplying a driving voltage to the electrostatic self-turn-off device to turn on the device, a switching circuit for performing on-off control of the driving voltage to provide a driving signal to the self-turn-off device, and a circuit for detecting the voltage of the driving control terminal and holding the potential of the driving control terminal below the driving voltage in response to the detected voltage reaching a predetermined value.

16 Claims, 4 Drawing Sheets

OVERCURRENT PROTECTIVE CIRCUIT FOR ELECTROSTATIC SELF-TURN-OFF DEVICES

BACKGROUND OF THE INVENTION

This invention relates to an overcurrent protective circuit for protecting electrostatic self-turn-off devices, such as a MOS-FET, a Bi-MOS, or an IGBT (Insulated Gate Bipolar Transistor) by limiting the gate voltage of these devices.

Being capable of switching high-frequency currents, the electrostatic self-turn-off devices have been used for the purpose of making the frequency of noise due to switching operations higher than audio frequencies The IGBT, above all, has been used for power inverters and converters because of its capability of switching large and high-frequency currents.

As shown in FIG. 1, in the electrostatic self-turn-off devices, the collector current $I_C$ is determined by the magnitude of the gate voltage $V_{GE}$, and the collector current $I_C$ increases as the gate voltage $V_{GE}$ increases.

As shown by an equivalent circuit in FIG. 2, an electrostatic self-turn-off device includes a collector-gate capacitance $C_{GC}$ and a gate-emitter capacitance $C_{GE}$ owing to its basic structure. Therefore, as the voltage between the collector and the emitter increases by $\Delta V_{CE}$ due to an increase in the collector current $I_C$, the voltage between the gate and the emitter increases by $\Delta V_{GE}$.

$$\Delta V_{GE} = \{C_{CG}/(C_{CG}+C_{GE})\} \times \Delta V_{CE}$$

Since $C_{CG} < C_{GE}$, $$\Delta V_{GE} \approx (C_{CG}/C_{GE}) \times \Delta V_{CE} \quad (1)$$

By this $\Delta V_{GE}$, the collector current $I_C$ is further increased and the increase in overcurrent is accelerated. It is possible to set the driving power source voltage at a low level in consideration of the above-mentioned voltage increase $\Delta V_{GE}$ However, this is not desirable because the saturation voltage during normal operation, namely $V_{CE}$ (sat) increases, thereby significantly increasing the saturation loss of the device.

Accordingly, there is disclosed an arrangement in Japanese Patent Application Laid-Open No. 63-95722, in which a Zener diode is connected between the gate terminal and the emitter terminal of an IGBT, so that the maximum value of the gate-emitter voltage of the IGBT is limited to the Zener voltage value of the Zener diode.

In addition, Japanese Patent Application Laid-Open No. 63-95728, reveals an arrangement in which a diode is connected between the gate terminal of an IGBT and the positive terminal of the gate driving power source, so that the maximum value of the gate-emitter voltage of the IGBT is limited substantially to the voltage value of the driving power source.

That is, the conventional overcurrent protective circuits are so arranged that when an overcurrent is detected, the gate voltage of the device is maintained at the driving power source or at a voltage value a little higher than the driving power source.

SUMMARY OF THE INVENTION

In contrast to the foregoing method, when an overcurrent is detected, if the gate voltage of the device is maintained below the voltage of the driving power source, the collector current of the device is reduced, quickly limiting the overcurrent to ensure that the device is prevented from being destroyed.

In electrostatic self arc-suppressing or self-turn-off devices, the collector-gate capacitance $C_{CG}$ and the gate-emitter capacitance $C_{GE}$ vary from device to device. However, it is desirable to provide an arrangement such that the gate voltage is maintained at the voltage of the driving power source during normal control operation regardless of the above-mentioned variations, and when an overcurrent is detected reliably, the gate voltage is reduced below the voltage of the driving power source. In such an arrangement, it is possible to securely protect the main device from the overcurrent, and stabilize the device operation when the device is operating normally.

An object of the present invention is to provide an overcurrent protective circuit with improved safety and reliability, which detects an overcurrent in an electrostatic self-turn-off device and suppresses the overcurrent.

An overcurrent protective circuit according to this invention comprises a power source to supply a driving voltage for turning on an electrostatic self-turn-off device, a switching circuit to perform on-off control of the driving voltage to provide a driving signal to the self-turn-off device, and a circuit to detect the voltage of a driving control terminal and maintain the potential of the driving control terminal below the driving voltage in response to the detected voltage reaching a predetermined value.

With an overcurrent protective circuit arranged as described, the turn-on voltage on the driving control terminal is maintained at a predetermined value of the driving voltage while the device is operating normally, and when an overcurrent is detected, the voltage on the driving control terminal is held below the normal driving voltage value, thereby quickly suppressing the overcurrent.

DESCRIPTION OF THE PREFERRED EMBODIMENTS

Figure 1:
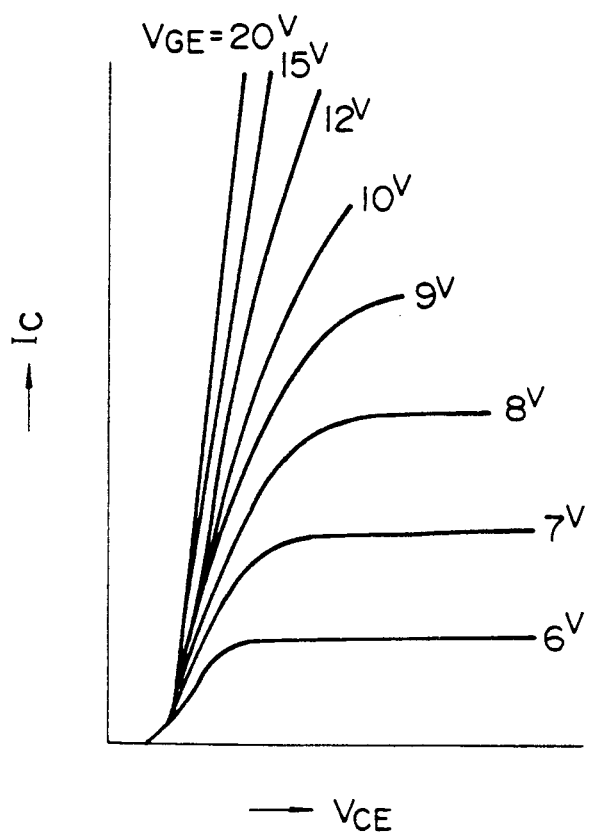
FIG. 1 is a collector characteristic diagram of an electrostatic self-turn-off device.
Figure 2:
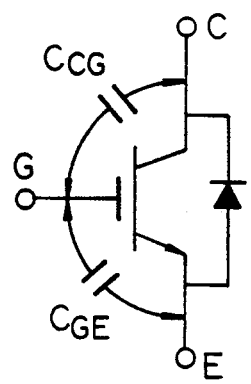
FIG. 2 is an equivalent circuit diagram of the electrostatic self-turn-off device.

An embodiment of the present invention will be described with reference to FIG. 3. Reference numeral 1 denotes an IGBT as a main device and reference numeral E1 denotes a driving power source to drive the main device, which is a constant-voltage source in most cases. Q2 denotes an NPN transistor as a switching means, R4 denotes a gate resistor of the main device 1 (hereafter referred to as the main gate resistor), and 2 denotes a gate-emitter voltage limiting circuit.

The main gate resistor R4, the switching means Q2 and the driving power source E1 are connected in series between the gate and the emitter of the main device 1.

R1 through R3 are resistors, ic is a logical inverter, and PH·CEL1 is a photocoupler electrically insulating the low voltage side from the high voltage side. Q1 is an NPN transistor, Q3 is a PNP transistor, and E2 is a constant-voltage source for reverse biasing.

This is a circuit configuration diagram for driving the main device 1 according to an input control signal A to the logical inverter ic.

When the output of the ic is "L", the PH·CEL1 is turned on, the transistors Q1 and Q3 are turned off, and the transistor Q2 is turned on, whereby a positive gate voltage value E1 is applied to the main device 1 which is therefore turned on.

When, on the other hand, the output of the ic is "H", the PH·CEL1 is turned off, the transistor Q2 is turned off, and the transistors Q1 and Q3 are turned on, whereby a negative gate voltage value E2 is applied to the main device which is turned off as a result. In the manner described, it is possible to have the main device 1 switch on and off according to an input signal to the ic.

When an abnormal collector current $I_C$ flows through the main device for some reason, the gate-emitter voltage $V_{GE}$ rises owing to the capacitance $C_{CG}$ between the collector C and the gate G and the capacitance $C_{GE}$ between the gate G and the emitter E, these capacitances resulting from the basic structure of the main device.

For electrostatic self-turn-off devices, the collector current $I_C$ that can flow therethrough is determined by the magnitude of the potential $V_{GE}$. $I_C$ increases as $V_{GE}$ rises.

As described above, for the electrostatic self-turn-off devices, when an abnormal current flows through the collector, the gate voltage $V_{GE}$ rises higher than the constant-voltage source value E1 for forward biasing as mentioned above, and a positive feedback loop is formed, whereby the main device is overdriven and the abnormal current is made to increase, thus deteriorating the main device.

According to this invention, there is provided a gate-emitter voltage limiting circuit 2 to detect an overcurrent in the device and hold the gate voltage below the driving power source voltage.

Figure 3:
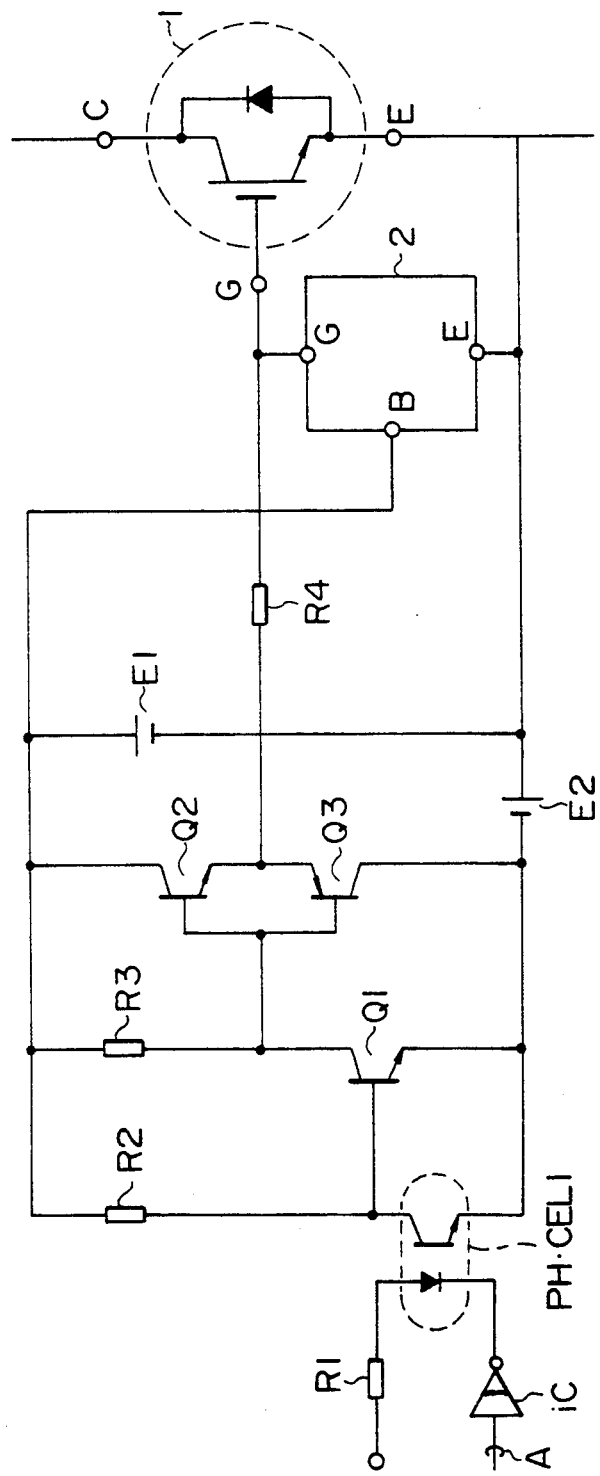
FIG. 3 is a driving circuit of an electrostatic self-turn-off device including a overcurrent protective circuit according to an embodiment of the present invention.
Figure 4:
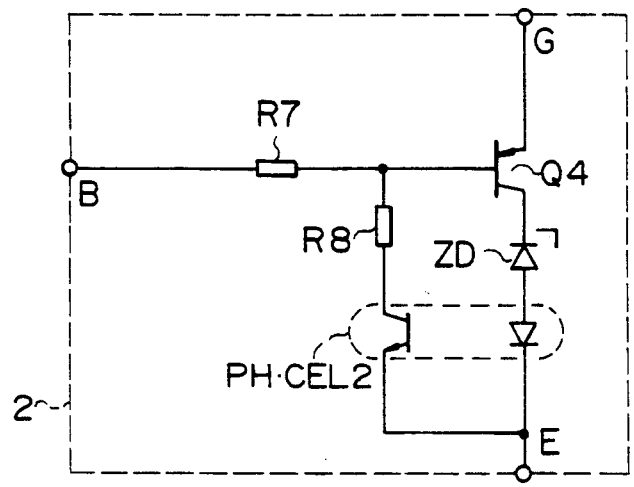
FIG. 4 is a circuit diagram of a first embodiment of a voltage limiting circuit in an overcurrent protective circuit which is applied to the circuit of FIG. 3.

FIG. 4 shows a first embodiment of the gate-emitter voltage limiting circuit 2 of FIG. 3.

The present embodiment includes a circuit between the gate and the emitter of the main device 1 for detecting a gate voltage of the main device, and when an abnormal current flows through the main device 1, the gate voltage is detected by means of the transistor Q4 and the resistor R7 through the detecting path from the collector C of the main device 1 → the gate G of the main device 1 → the transistor Q4 → the resistor R7 → the constant-voltage source E1 for forward biasing → the emitter of the main device 1.

Q4 is a PNP transistor as a switching device and R7 is a base resistor (hereafter referred to as the secondary base resistor) of the transistor Q4. While serving as a switching device, the transistor Q4 also forms a comparator in combination with the secondary base resistor R7.

ZD is a Zener diode which serves as a clamping circuit. A voltage lower than the voltage of the driving power source E1 is selected for the Zener voltage of the Zener diode.

The secondary base resistor R7 is connected between the positive terminal side of the driving power source E1 and the base terminal of the transistor Q4.

If the potential of the gate becomes higher than the driving power source for forward biasing, the transistor Q4 and the photocoupler PH·CEL2 are turned on through the above-mentioned path, whereby the gate voltage value of the main device is limited to a value which is substantially virtually equal to the Zener voltage value of the Zener diode ZD.

Thus, only when an abnormal current flows through the main device 1, the gate-emitter voltage can be limited to below the constant-voltage source value E1 for forward biasing. Therefore, it is possible to suppress the increase of the collector current of the main device, thereby greatly improving the reliability of the main device.

Figure 5:
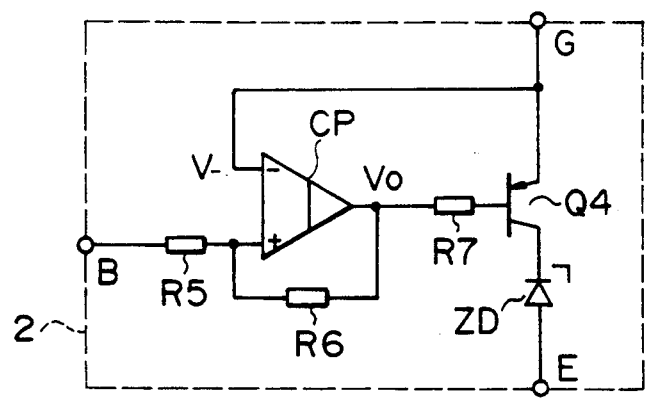
FIG. 5 is a circuit diagram of a second embodiment of the voltage limiting circuit of FIG. 4.

FIG. 5 shows a second embodiment of the present invention. The gate voltage is compared with the driving power source voltage by the comparator CP, and only when an abnormal current is detected which is due to a short-circuit, the output of the comparator CP goes "L", turning on the transistor Q4, thereby limiting the gate voltage to below the voltage value of the constant-voltage source E1 for forward biasing. In the second embodiment, the comparing means comprises the comparator CP, the transistor Q4, the secondary base resistor R7, and the resistors R5 and R6.

The emitter terminal of the transistor Q4 is connected between the gate terminal of the main device 1 and the resistor R4. The Zener diode has its anode terminal connected with the emitter terminal of the main device 1 and its cathode terminal connected with the collector terminal of the transistor Q4.

When an abnormal current flows through the main device, the gate voltage of the main device rises, and when this gate voltage becomes higher than the voltage value of the driving power source E1 for forward biasing, the output of the comparator CP goes "L", thereby turning on the transistor Q4.

Figure 6:
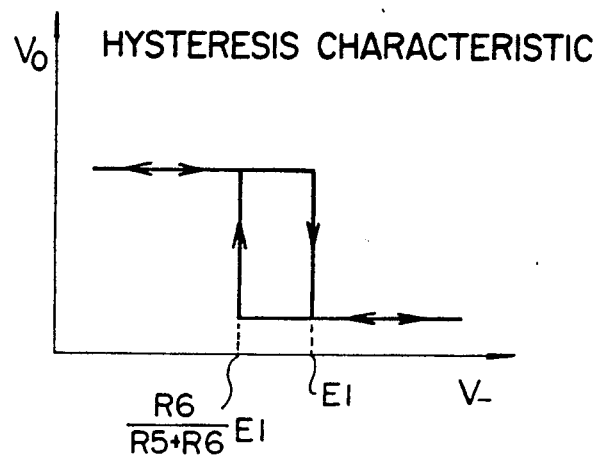
FIG. 6 is a voltage hysteresis diagram utilized in the embodiments of the present invention.

The circuit configuration is such that the comparator CP exhibits the hysteresis characteristics because of the resistors R5 and R6 connected therewith as shown in FIG. 6.

Therefore, when the gate voltage of the main device 1 is limited to substantially the Zener voltage, the gate voltage is held at this level so long as it does not become lower than the divided voltage value of $\{R6 \times E1/(R5+R6)\}$ in the series string of the resistors R5 and R6.

Figure 7:
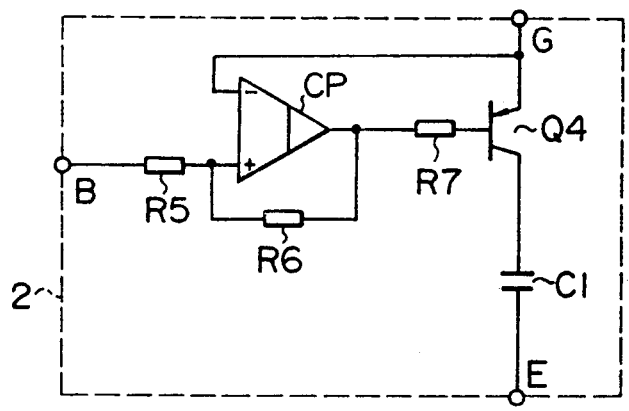
FIG. 7 is a circuit diagram of a third embodiment of the voltage limiting circuit in an overcurrent protective circuit applied in the circuit of FIG. 3.

FIG. 7 shows a third embodiment wherein in place of the Zener diode used as a clamping circuit, a capacitor C1 is connected between the collector terminal of the transistor Q4 and the emitter terminal of the main device 1.

If a capacitance value far larger than the collector-gate stray capacitance value $C_{CG}$ is selected for the capacitor C1, $V_{GE}$ becomes substantially zero according to the equation (1), thus preventing the gate voltage from increasing and precluding a runaway of the collector current.

Exactly the same effect can be obtained by packaging a circuit according to the present invention and a main device (a MOS-FET, a Bi-MOS, or an IGBT) in the same module.

According to the present invention, the gate voltage of the main device is compared directly with the driving power source voltage, and in response to detection of the gate voltage becoming higher than the voltage of the driving power source, the gate voltage can be immediately clamped at a voltage lower than the voltage of the driving power source. This makes it possible to securely protect the main device from an overcurrent. During a normal operation, the gate voltage of the main device is maintained at the voltage value of the driving power source, so that the main device can operate stably.

We claim:

1. An overcurrent protective circuit for an electrostatic self-turn-off device having a driving control terminal, comprising:
    power source means for providing a driving voltage for turning on the electrostatic self-turn-off device;
    first switching means for selectively supplying and not supplying the driving voltage from the power source means to the driving control terminal of the electrostatic self-turn-off device to respectively turn on and turn off the electrostatic self-turn-off device;
    holding means for holding a voltage at the driving control terminal to a voltage less than the driving voltage when the holding means is connected to the driving control terminal; and
    second switching means for detecting the voltage at the driving control terminal and for connecting the holding means to the driving control terminal when the detected voltage becomes at least equal to a predetermined voltage, whereby causing the holding means to hold the voltage at the driving control terminal to the voltage less than the driving voltage.

2. An overcurrent protective circuit according to claim 1, wherein the holding means includes a Zener diode having a Zener voltage less than the driving voltage and holds the voltage at the driving control terminal to substantially the Zener voltage.

3. An overcurrent protective circuit according to claim 2, wherein the second switching means includes:
    a comparator for comparing the voltage at the driving control terminal with a predetermined reference voltage indicative of the driving voltage and for outputting a voltage holding signal when the voltage at the driving control terminal becomes at least equal to the predetermined reference voltage; and
    a switching element responsive to the voltage holding signal for connecting the Zener diode to the driving control terminal when the comparator outputs the voltage holding signal.

4. An overcurrent protective circuit according to claim 3, wherein the comparator has a hysteresis characteristic that causes the comparator to continue outputting the voltage holding signal when the voltage at the driving control terminal becomes less than the predetermined reference voltage.

5. An overcurrent protective circuit according to claim 1, wherein the holding means includes a capacitor and holds the voltage at the driving control terminal to a voltage determined by the capacitor, the voltage determined by the capacitor being less than the driving voltage.

6. An overcurrent protective circuit according to claim 5, wherein the second switching means includes:
    a comparator for comparing the voltage at the driving control terminal with a predetermined reference voltage indicative of the driving voltage and for outputting a voltage holding signal when the voltage at the driving control terminal becomes at least equal to the predetermined reference voltage; and
    a switching element responsive to the voltage holding signal for connecting the capacitor to the driving control terminal when the comparator outputs the voltage holding signal.

7. An overcurrent protective circuit according to claim 6, wherein the comparator has a hysteresis characteristic that causes the comparator to continue outputting the voltage holding signal when the voltage at the driving control terminal becomes less than the predetermined reference voltage.

8. An overcurrent protective circuit according to claim 1, wherein an overcurrent in the electrostatic self-turn-off device exceeding a normal current range of the electrostatic self-turn-off device causes the voltage at the driving control terminal to become at least equal to the predetermined voltage, and wherein the holding means reduces the overcurrent to a current within the normal current range by holding the voltage at the driving control terminal to the voltage less than the driving voltage.

9. An overcurrent protective circuit for an insulated gate bipolar transistor (IGBT) having a gate terminal, comprising:
    power source means for providing a driving voltage for turning on the IGBT;
    first switching means for selectively supplying and not supplying the driving voltage from the power source means to the gate terminal of the IGBT to respectively turn on and turn off the IGBT;
    holding means for holding a gate voltage at the gate terminal to a voltage less than the driving voltage when the holding means is connected to the gate terminal; and
    second switching means for detecting the gate voltage and for connecting the holding means to the gate terminal when the detected gate voltage becomes at least equal to a predetermined gate voltage, thereby causing the holding means to hold the gate voltage to the voltage less than the driving voltage.

10. An overcurrent protective circuit according to claim 9, wherein the holding means includes a Zener diode having a Zener voltage less than the driving voltage and holds the voltage at the driving control terminal to substantially the Zener voltage.

11. An overcurrent protective circuit according to claim 10, wherein the second switching means includes:
    a comparator for comparing the gate voltage with a predetermined reference voltage indicative of the driving voltage and for outputting a voltage holding signal when the gate voltage becomes at least equal to the predetermined reference voltage; and
    a switching element responsive to the voltage holding signal for connecting the Zener diode between the gate terminal and an emitter terminal of the IGBT when the comparator outputs the voltage holding signal, thereby causing the Zener diode to hold a voltage between the gate terminal and the emitter terminal to substantially the Zener voltage.

12. An overcurrent protective circuit according to claim 11, wherein the comparator has a hysteresis characteristic that causes the comparator to continue outputting the voltage holding signal when the gate voltage becomes less than the predetermined reference voltage.

13. An overcurrent protective circuit according to claim 9, wherein the holding means includes a capacitor and holds the gate voltage to a voltage determined by the capacitor, the voltage determined by the capacitor being less than the driving voltage, the capacitor having a capacitance sufficiently larger than the stray capacitance between the gate terminal and a collector terminal of the IGBT such that the holding means substantially prevents a voltage between the gate terminal and an emitter terminal of the IGBT from increasing when the holding means is connected to the gate terminal.

14. An overcurrent protective circuit according to claim 13, wherein the second switching means includes:
a comparator for comparing the gate voltage with a predetermined reference voltage indicative of the driving voltage and for outputting a voltage holding signal when the gate voltage becomes at least equal to the predetermined reference voltage; and
a switching element responsive to the voltage holding signal for connecting the capacitor between the gate terminal and the emitter terminal when the comparator outputs the voltage holding signal, thereby causing the capacitor to hold the voltage between the gate terminal and the emitter terminal to the voltage determined by the capacitor.

15. An overcurrent protective circuit according to claim 14, wherein the comparator has a hysteresis characteristic that causes the comparator to continue outputting the voltage holding signal when the gate voltage becomes less than the predetermined reference voltage.

16. An overcurrent protective circuit according to claim 9, wherein an overcurrent in the IGBT exceeding a normal current range of the IGBT causes the voltage at the gate terminal to become at least equal to the predetermined voltage, and wherein the holding means reduces the overcurrent to a current within the normal current range by holding the voltage at the gate terminal to the voltage less than the driving voltage.

* * * * *